(12) United States Patent
Ishihara (10) Patent No.: US 9,627,187 B2
(45) Date of Patent: Apr. 18, 2017

(54) SPUTTERING APPARATUS (71) Applicant: CANON ANELVA CORPORATION, Kawasaki-shi (JP)

(72) Inventor: Shigenori Ishihara, Yokohama (JP)

(73) Assignee: CANON ANELVA CORPORATION, Kawasaki-shi, Kanagawa-ken (JP)

( * ) Notice: Subject to any disclaimer, the term of this patent is extended or adjusted under 35 U.S.C. 154(b) by 91 days.

(21) Appl. No.: 14/484,634

(22) Filed: Sep. 12, 2014

(65) Prior Publication Data
US 2014/0374250 A1 Dec. 25, 2014

Related U.S. Application Data

(63) Continuation of application No. PCT/JP2012/006146, filed on Sep. 26, 2012.

(30) Foreign Application Priority Data

Mar. 14, 2012 (JP) .................. 2012-057300

(51) Int. Cl.
*H01J 37/34* (2006.01)
*C23C 14/34* (2006.01)

(52) U.S. Cl.
CPC ...... *H01J 37/3447* (2013.01); *C23C 14/3464* (2013.01); *H01J 37/34* (2013.01); *C23C 14/34* (2013.01)

(58) Field of Classification Search
CPC .... H01J 37/3447; H01J 37/34; H01J 37/3441; C23C 14/34; C23C 14/564; C23C 14/3464
See application file for complete search history.

(56) References Cited

U.S. PATENT DOCUMENTS 7,850,827 B2 * 12/2010 Nomura ............... C23C 14/3464
204/192.1
8,118,981 B2 2/2012 Tsunekawa
(Continued)

FOREIGN PATENT DOCUMENTS

CN 101469406 7/2009
CN 101970712 2/2011
(Continued)

OTHER PUBLICATIONS

Notification of First Office Action issued in corresponding Chinese Patent Application No. 201280071339.X; dated Sep. 6, 2015; with English Translation (10 pages).
(Continued)

*Primary Examiner* — Michael Band
(74) *Attorney, Agent, or Firm* — BUCHANAN INGERSOLL & ROONEY PC (57) ABSTRACT

A sputtering apparatus includes a deposition preventing plate arranged between a substrate stage and a plurality of cathode electrodes, and a shutter plate arranged between the deposition preventing plate and the substrate stage. The deposition preventing plate has holes at positions respectively facing a plurality of targets held by the plurality of cathode electrodes. Concentric concavo-convex shapes centered on the rotation axis of the shutter plate are formed on surfaces, that face each other, of the deposition preventing plate and the shutter plate.

19 Claims, 8 Drawing Sheets

(56) References Cited

U.S. PATENT DOCUMENTS

| | | | |
|---|---|---|---|
| 8,147,664 B2 | 4/2012 | Yamaguchi et al. | |
| 2009/0166195 A1 | 7/2009 | Kobayashi et al. | |
| 2010/0243438 A1* | 9/2010 | Yamaguchi | C23C 14/34 |
| | | | 204/298.11 |

FOREIGN PATENT DOCUMENTS

| | | |
|---|---|---|
| JP | 58-210166 A | 12/1983 |
| JP | 4-202768 A | 7/1992 |
| JP | 9-143716 A | 6/1997 |
| JP | 4137277 B2 | 8/2008 |
| JP | 2009-155706 A | 7/2009 |
| JP | 2009-221595 A | 10/2009 |
| JP | 2010-126798 A | 6/2010 |
| JP | 2010-209463 | 9/2010 |
| JP | 2010-255034 A | 11/2010 |
| JP | 2011-001597 A | 1/2011 |
| TW | 201202456 A | 1/2012 |
| WO | WO 2010/061589 A1 | 6/2010 |

OTHER PUBLICATIONS

International Search Report (PCT/ISA/210) mailed on Jan. 8, 2013, by the Japanese Patent Office as the International Searching Authority for International Application No. PCT/JP2012/006146.
Written Opinion (PCT/ISA/237) mailed on Jan. 8, 2013, by the Japanese Patent Office as the International Searching Authority for International Application No. PCT/JP2012/006146.
Office Action (Notice of Allowance) issued on Dec. 2, 2014, by the Taiwanese Patent Office, in corresponding Taiwanese Patent Application No. 102106970. (3 pgs).

\* cited by examiner

SPUTTERING APPARATUS

This application is a continuation of International Patent Application No. PCT/JP2012/006146 filed on Sep. 26, 2012, and claims priority to Japanese Patent Application No. 2012-057300 filed on Mar. 14, 2012, the entire content of both of which is incorporated herein by reference.

TECHNICAL FIELD

The present invention relates to a sputtering apparatus including a vacuum chamber and, more particularly, to a sputtering apparatus capable of switching a target to be used for sputtering between a plurality of targets by a shutter mechanism.

BACKGROUND ART

A deposition apparatus that deposits a thin film on a substrate in a vacuum chamber has been used in various industrial fields from long ago. In recent years, as represented by a semiconductor device and memory, stacking of a very thin film on the nanometer order is increasingly required. To meet such demand, among PVD (Physical Vapor Deposition) apparatuses that can deposit a very thin film of high purity, an apparatus that can form a stacked structure with high productivity and interface controllability by arranging two or more targets made of different materials in one chamber is frequently used.

Figure 7:
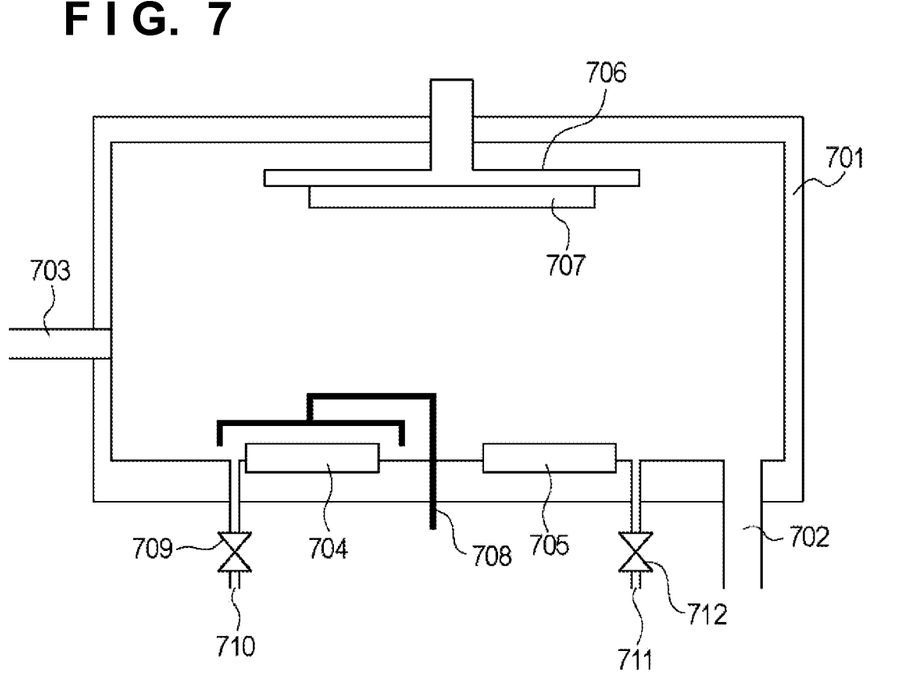
FIG. 7 is a schematic view showing the structure of a multi-target sputtering apparatus according an example of the conventional technique (PTL 1)

FIG. 7 shows a sputtering apparatus including a plurality of targets as an example of a conventional technique. Such apparatus is disclosed in, for example, PTL 1.

Referring to FIG. 7, reference numeral 701 denotes a vacuum chamber configured to have an airtight structure, which is connected to an exhaust means (not shown) via an exhaust port 702 provided on the chamber wall, and is also connected to a sputtering gas instruction means 703.

A stage 706 is provided in the vacuum chamber 701, and configured to be able to fix an object 707 to be processed. Targets 704 and 705 made of a pure metal or metal compound are arranged in the vacuum chamber 701, and connected to a DC power supply (not shown) while being electrically insulated from the vacuum chamber 701. A switching means (not shown) is connected between the DC power supply and the targets 704 and 705, and can be used to select one of the targets 704 and 705 and supply power to it.

Furthermore, a shutter mechanism 708 including a rotation mechanism (not shown) is provided between the targets 704 and 705 and the object 707 to be processed. By causing the rotation mechanism to drive the shutter mechanism 708, it is possible to set one of the targets 704 and 705 in a shielded state and expose the other target to the object 707 to be processed.

A magnet (not shown) is provided in proximity to the atmosphere side of each of the targets 704 and 705, thereby enabling a magnetic field to be formed on a surface to be sputtered of each of the targets 704 and 705. When the object 707 to be processed is fixed to the stage 706, the DC power switching means is connected to the target 704 side, and the shutter mechanism 708 is driven to set the target 705 side in the shielded state, it is possible to form a film on the object 707 to be processed by particles sputtered from the target 704. When the switching means and the shutter mechanism 708 are respectively switched to the opposite sides to supply DC power to the target 705, it is possible to stack the film of the target 705 without extracting the object 7 to be processed from the chamber.

In the above-described technique, however, sputtered particles adhere from the sputtered target to the surface of the target that is not used for sputtering and its adjacent shield, and contamination occurs when the target is switched to perform deposition.

In the technique disclosed in PTL 1 described above, in the apparatus shown in FIG. 7, a gas introduction tube 710 and a valve 709 are provided near the target 704, and another gas introduction tube 711 and another valve 712 are provided near the target 705. In this arrangement, in addition to a gas introduced from the sputtering gas introduction means 703, a gas (to be referred to as a purge gas hereinafter) is introduced through the gas introduction tube and valve near the unused target to make the pressure in the vicinity of the unused target higher than that in the sputtering space, thereby making it possible to prevent contamination from the sputtered target.

In the technique described in PTL 1, however, by introducing a purge gas in addition to a sputtering gas, the purge gas reaches near the target used for sputtering, and it is thus impossible to make full use of the intended sputtering performance.

Figure 8:
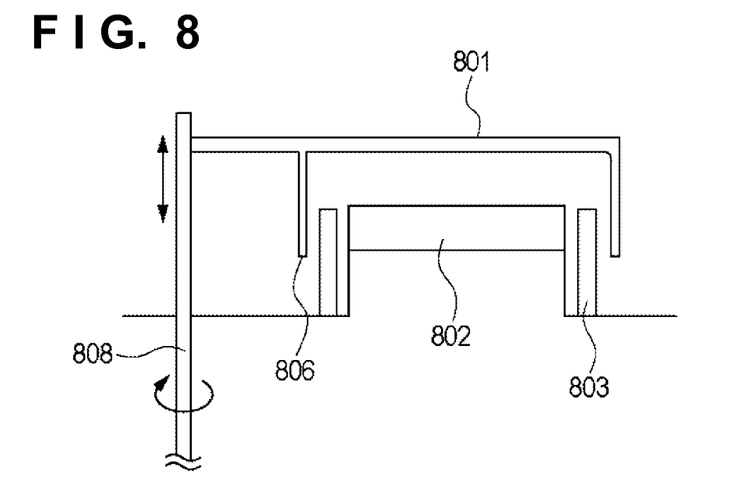
FIG. 8 is a view showing the structure of a shutter portion in a sputtering apparatus according to another example of the conventional technique (PTL 2)

As a technique of reducing leakage of sputtered particles from the sputtered target to the outside, PTL 2 is disclosed (FIG. 8). In PTL 2, a rotating shutter 801 is configured to further drive in a straight line. Since the rotating shutter 801 can drive to also cover the side portions of a target 802 when shielding the target 802, thereby preventing sputtered particles from leaking from the target 802 to its periphery. Referring to FIG. 8, reference numeral 803 denotes an anode electrode; and 806, a ring-shaped cover capable of covering the anode electrodes 803.

It is, however, necessary to provide a power source such as a motor on the atmosphere side in the driving mechanism. Therefore, a complicated mechanism is required to simultaneously implement linear driving and rotation of the shutter mechanism in the vacuum chamber, thereby decreasing the reliability of the apparatus and increasing the cost.

Figure 9:
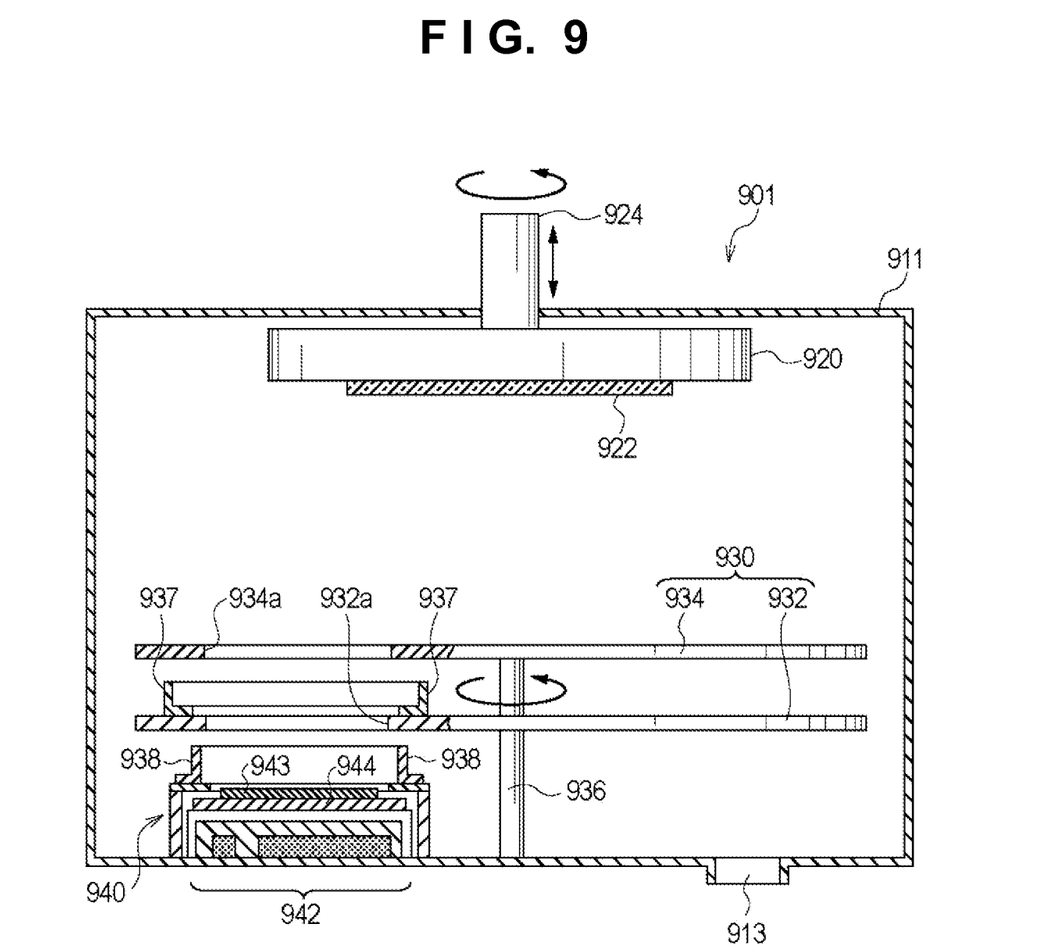
FIG. 9 is a view showing the structure of a shutter portion in a sputtering apparatus according to still another example of the conventional technique (PTL 3)

Furthermore, as a sputtering apparatus that can prevent cross contamination by a double rotation shutter mechanism, PTL 3 is disclosed (FIG. 9). PTL 3 discloses a sputtering apparatus including a plurality of sputtering cathodes 942 provided in a vacuum container 911, a double rotation shutter mechanism, and a first deposition preventing shield 938. The double rotation shutter mechanism includes a first shutter plate 932 and a second shutter plate 934 that are individually, rotatably disposed. At least one opening 932a or 934a is formed in each of the first shutter plate 932 and the second shutter plate 934. The second shutter plate 934 is arranged at a position farther than that of the first shutter plate 932 from the sputtering cathode 942. The first deposition preventing shield 938 is disposed between the sputtering cathode 942 and the first shutter plate 932 to surround the side surfaces of the front region, on the first shutter plate 932 side, of the sputtering cathode 942.

In PTL 3, a cylindrical second deposition preventing shield 937 is provided between the second shutter plate 934 and the circumference of the first opening 932a formed on the first shutter plate 932 disposed on the side of a target 944, among the two shutter plates 932 and 934 constituting the double rotation shutter mechanism. The cylindrical first deposition preventing shield 938 is disposed between the sputtering cathode 942 and the first shutter plate 932 to surround the periphery of the front region of the target 944.

This prevents sputtered materials from passing through the gap between the first shutter plate 932 and the second shutter plate 934 and that between the first shutter plate 932 and the sputtering cathode 942.

Figure 10:
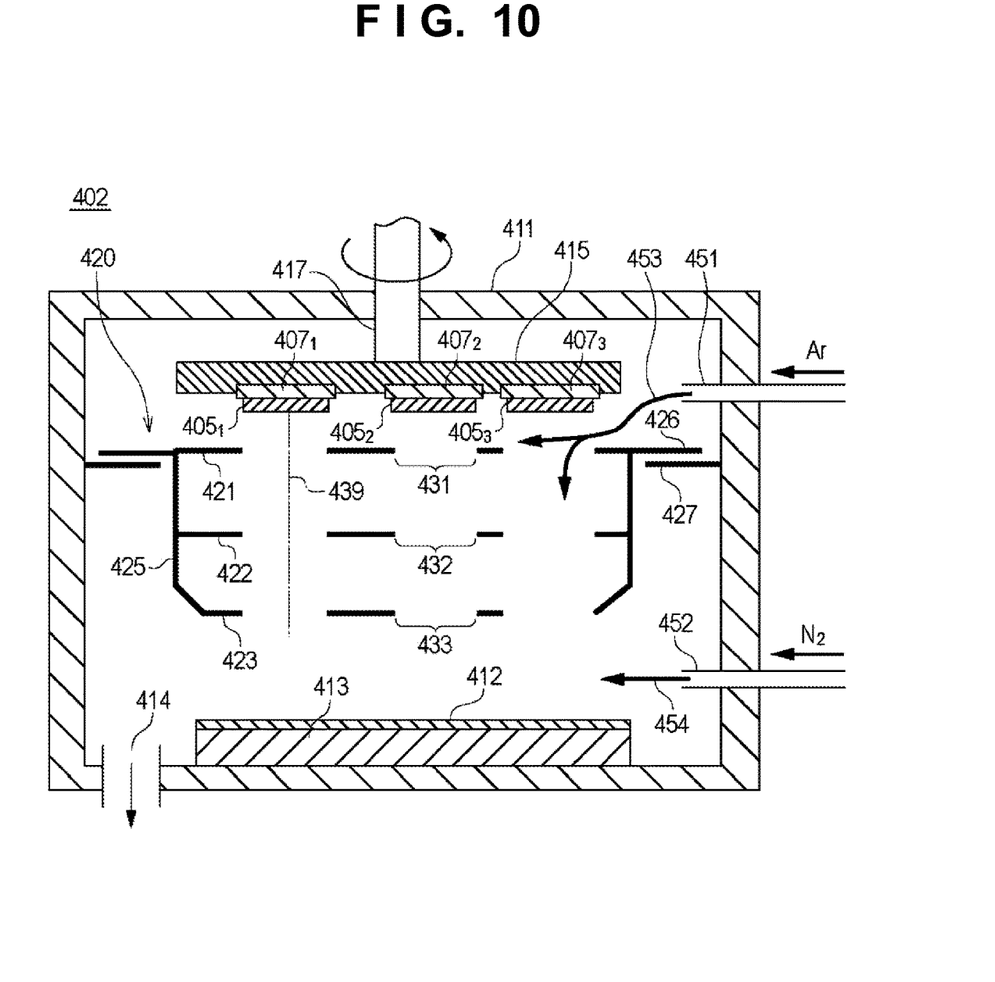
FIG. 10 is a schematic view showing the structure of a sputtering apparatus according to still another example of the conventional technique (PTL 4).

On the other hand, PTL 4 discloses a sputtering apparatus that can make an incidence angle small (FIG. 10). PTL 4 discloses a sputtering apparatus including a vacuum tank 411, a substrate arrangement portion 413 arranged in the vacuum tank 411, and a plurality of targets $405_1$ to $405_9$ arranged to face the substrate arrangement portion 413, wherein shield plates 421 to 423 in each of which a plurality of holes 431, 432, or 433 are formed are arranged at intervals between the substrate arrangement portion 413 and the plurality of targets $405_1$ to $405_9$. In PTL 4, sputtered particles obliquely emitted from the targets $405_1$ to $405_3$ adhere to the surfaces of the shield plates 421 to 423, and only vertically emitted particles can reach the surface of a substrate 412. Therefore, it is possible to uniformly form a thin film in micropores having a high aspect. When a sputtering gas is introduced from the vicinity of the targets 4051 to 4053, a reactive gas is introduced from the vicinity of the substrate 412, and the vacuum tank is evacuated from the vicinity of the substrate 412, no reactive gas enters the side of the targets $405_1$ to $405_3$, and thus it is possible to prevent the surfaces of the targets $405_1$ to $405_3$ from being altered.

CITATION LIST

Patent Literature

PTL 1: Japanese Patent Laid-Open No. 04-202768
PTL 2: Japanese Patent Laid-Open No. 58-210166
PTL 3: Japanese Patent Laid-Open No. 2010-209463
PTL 4: Japanese Patent No. 4137277

SUMMARY OF INVENTION

Technical Problem

In PTL 3, however, narrowing clearance around the shutter plates as driving parts increases the risk of the interference between the shutter plates, thereby decreasing the reliability of the apparatus.

On the other hand, in the sputtering apparatus described in PTL 4, sputtered particles obliquely emitted from the targets 4051 to 4053 adhere to the surfaces of the shield plates 421 to 423, and only vertically emitted particles can reach the surface of the substrate 412, thereby uniformly forming a thin film in micropores having a high aspect. However, the sputtering apparatus described in PTL 4 cannot suppress contamination between the targets. A technique of solving this problem is not known as far as the present inventor knows.

The present invention has been made in consideration of the above problems, and has as its object to provide a technique capable of suppressing contamination between targets without impairing the reliability in a sputtering apparatus including a plurality of targets.

Solution to Problem

To solve the above problems, according to an invention defined in claim 1 of the present application, there is provided a sputtering apparatus including a vacuum chamber, a substrate stage provided in the vacuum chamber and configured to hold a substrate, a plurality of cathode electrodes provided to face the substrate stage and configured to hold a target, and a deposition preventing plate arranged between the substrate stage and the cathode electrodes and having holes formed at positions respectively facing the plurality of targets, the apparatus comprising a shutter plate arranged between the deposition preventing plate and the substrate stage, the shutter plate having at least one hole formed to expose the target to the substrate, and setting the target and the substrate in a shielded state or non-shielded state by rotating about a rotation axis, wherein concentric concavo-convex shapes centered on the rotation axis of the shutter plate are formed on surfaces, that face each other, of the deposition preventing plate and the shutter plate, and the concavo-convex shapes formed on the respective surfaces are formed so that concave portions and convex portions of the respective concavo-convex shapes face each other and are staggered.

The deposition preventing plate is provided so that no film adheres to the wall surface portion between the targets. However, the present invention is not particularly limited to this region, and the deposition preventing plate may protect a wider range. For example, the deposition preventing plate may have a shape so as to cover the half portion of the inner wall of the vacuum chamber on the target side. The deposition preventing plate need not be formed by one shield plate, and may have a shape obtained by combining a plurality of shield plates.

The shape of the shutter plate is not particularly limited as long as a shield surface obtained by forming a concavo-convex shape on the shutter plate is provided between the respective targets regardless of whether each target is in a used state or unused state. For example, a mechanism may be used in which the shutter plate is formed by one circular shield plate, an opening for passing sputter particles is formed in the circular shield plate, and then the shutter plate is rotated about the center of the circular shield plate to switch the target used. Alternatively, a shutter plate formed by a circular shield plate is provided between the respective targets, and the plurality of circular shield plates may implement the function. A shutter plate may be formed by one circular shield plate, and a plurality of openings may be formed in the one shield plate, thereby allowing not only one target but also two or more targets to be simultaneously used for sputtering depending on the angle.

To achieve the above object, according to an invention defined in claim 2, there is provided the sputtering apparatus according to the invention defined in claim 1, wherein a width of the concave portion of the concavo-convex shape is smaller than a size of the target.

With respect to an arcuate concavo-convex shape, the sectional shape is not particularly limited as long as a shape that draws an arc centered on the rotation axis of the shutter plate. The concavo-convex surface may be formed by rectangles, triangles, or a curve. It is not necessary to have an arcuate shape as long as a concavo-convex shape is formed along the moving direction of the shutter plate.

The shapes of the rear surfaces, on which the concavo-convex shapes are formed and which face each other, of the deposition preventing plate and the shutter plate have no influence on the effects of the present invention.

That is, each of the deposition preventing plate and shutter plate may be bent in a concavo-convex shape, and have a concavo-convex shape formed on its rear surface side, or projections or recesses may be formed on each of the deposition preventing plate and shutter plate so that no concavo-convex shape is formed on the rear surface side.

Furthermore, one or a plurality of arcuate concavo-convex shapes may be formed. There is no problem even if an arc is disconnected midway.

To achieve the above object, according an invention defined in claim 3, there is provided the sputtering apparatus according to the invention defined in claim 1, wherein a height of the convex portion of the concavo-convex shape formed on the shutter plate is equal to a height of the convex portion of the concavo-convex shape formed on the deposition preventing plate.

To achieve the above object, according to an invention defined in claim 4, there is provided the sputtering apparatus according to the invention defined in claim 1, wherein the height of the convex portion of the concavo-convex shape formed on the shutter plate and the height of the convex portion of the concavo-convex shape formed on the deposition preventing plate are larger than a spacing between the convex portion of the concavo-convex shape formed on the shutter plate and the concave portion of the concavo-convex shape formed on the deposition preventing plate and a spacing between the concave portion of the concavo-convex shape formed on the shutter plate and the convex portion of the concavo-convex shape formed on the deposition preventing plate.

To achieve the above object, according to an invention defined in claim 5, there is provided the sputtering apparatus according to the invention defined in claim 1, wherein the concavo-convex shape formed on the deposition preventing plate and the concavo-convex shape formed on the shutter plate are formed by films made of materials different from base materials of the deposition preventing plate and the shutter plate, respectively. Note that forming the concavo-convex shape by a film indicates that it is possible to use various techniques such as thermal spraying, CVD, and sputtering. A shape may be obtained by forming a film in only the convex portions, or a concavo-convex shape may be formed by changing the film thickness of the formed film depending on the location.

To achieve the above object, according to an invention defined in claim 6, there is provided the sputtering apparatus according to the invention defined in claim 1, wherein the plurality of targets are arranged on the same circumference about the rotation axis. Note that the centers of the targets need only be on the same circumference about the rotation axis. The angles of the target surfaces, the distance to the object to be processed, and the like can be arbitrarily configured.

To achieve the above object, according to an invention defined in claim 7, there is provided the sputtering apparatus according to the invention defined in claim 1, wherein the surfaces of the shutter plate and the deposition preventing plate, that face each other, are curved surfaces.

To achieve the above object, according to an invention defined in claim 8, there is provided the sputtering apparatus according to the invention defined in claim 1, wherein the deposition preventing plate satisfies $(R_n+W_n)\cos(\theta_n/2) \leq R_n$ where $R_n$ represents an inner diameter of the concave portion of the concavo-convex shape on the surface facing the shutter plate, $W_n$ represents a width of the concave portion, and $\theta_n$ represents a smaller one of arc angles of the convex portions on the both sides of the concave portion.

To achieve the above object, according to an invention defined in claim 9, there is provided the sputtering apparatus according to the invention defined in claim 1, further comprising a first shield configured to surround a sputtering space between the substrate stage and the targets, and a cylindrical second shield configured to surround an outer circumferential surface of the target.

To achieve the above object, according to an invention defined in claim 10, there is provided the sputtering apparatus according to the invention defined in claim 1, wherein the deposition preventing plate includes a discharge port of a sputtering gas on the surface facing the shutter plate.

To achieve the above object, according to an invention defined in claim 11, there is provided the sputtering apparatus according to the invention defined in claim 9, wherein a discharge port of a sputtering gas is provided at a distal end of the cylindrical second shield.

To achieve the above object, according to an invention defined in claim 12, there is provided the sputtering apparatus according to the invention defined in claim 9, wherein the second shield and the deposition preventing plate contact each other through a perimeter of the second shield. Note that the second shield and the deposition preventing plate can be in any contact state as long as it is possible to shield passage of a gas or sputtered particles. A position on the second shield where the second shield and the deposition preventing plate contact each other does not matter. As for the contact state, the second shield and the deposition preventing plate may be fixed or may only contact each other.

Advantageous Effects of Invention

According to the invention defined in claim 1 of the present application, in the sputtering apparatus including the plurality of targets, the deposition preventing plate and the shutter plate for protecting the wall surface of the vacuum chamber form shield surfaces facing each other between the respective targets, and concavo-convex shapes facing the shield surfaces are concentrically formed about the rotation axis of the shutter plate.

Since the concavo-convex shapes face each other and are concentrically formed, the rotation of the shutter plate does not cause the shutter plate and deposition preventing plate to contact each other. Therefore, there is no concern about impairing the reliability.

According to the invention defined in claim 2 of the present application, the width of the concave portion of each concavo-convex shape is formed to be smaller than the size of the target, it is possible to suppress contamination by significantly restricting the orbit of sputtered particles reaching from the sputtered target to the unused target.

The invention defined in claim 3 of the present application is desirable in terms of both the reliability of driving of the shutter plate and prevention of contamination.

According to the invention defined in claim 4 of the present application, the sputtered particles are effectively prevented from passing between the shutter plate and the deposition preventing plate.

According to the invention defined in claim 5 of the present application, since the arcuate concavo-convex shape is formed by a film made of a material different from the base material of the deposition preventing plate or shutter plate, if a sputtering film adheres to the deposition preventing plate or shutter plate by a given amount, reproduction can be readily performed by selectively removing the film, thereby contributing to reduced operation cost of the apparatus.

According to the invention defined in claim 6 of the present application, since the plurality of targets are arranged on the same circumference about the rotation axis of the shutter plate, it is possible to effectively arrange the arcuate concavo-convex shapes for shielding sputtered particles between the targets.

According to the invention of claim 7 of the present application, the surfaces facing each other of the shutter plate and the deposition preventing plate are curved surfaces, which is preferable since it is possible to further prevent the movement of the sputtered particles between the targets.

According to the invention of claim 8 of the present application, the deposition preventing plate is formed to satisfy $(Rn+Wn)\cos(\theta n/2) \leq Rn$ where Rn represents the inner diameter of the concave portion of the concavo-convex shape on the surface facing the shutter plate, Wn represents the width of the concave portion, and θn represents a smaller one of the arc angles of the convex portions on the both sides of the concave portion. This conditional expression holds when the two ends of an arcuate path cannot be linearly connected. That is, when the sputtered particles emitted from one of the targets pass through the concave portion of the arcuate concavo-convex shape to be scattered toward the other target, they always collide against the wall surface of the arcuate path, and thus cannot directly enter the other target. The invention is, therefore, preferable to prevent contamination by the sputtered particles.

According to the invention of claim 9 of the present application, it is possible to prevent the sputtered particles from being scattered from the portion between the target and the deposition preventing plate by further providing the cylindrical second shield to surround the outer circumferential surface of the target. Also, by further providing the first shield to surround the sputtering space between the substrate stage and the target, it is possible to prevent the sputtered particles from being scattered to the inner wall of the vacuum chamber even if the sputtered particles are scattered from the portion between the target and the deposition preventing plate.

According to the invention of claim 10 of the present application, since a discharge port of a sputtering gas is provided on the first surface facing the shutter plate, the deposition preventing plate can be configured so that the gas pressure of the discharge port region is higher than that of the remaining region between the targets for which contamination should be suppressed. Furthermore, in the region where the pressure of the discharge port is high, the probability that the sputtered particles collide with gas molecules is high, and it is thus possible to decrease the kinetic energy. Consequently, since it is possible to increase the probability that the sputtered particles are captured when they collide against the shield surface on which the concavo-convex shape is formed, this arrangement is preferable.

According to the invention of claim 11 of the present application, since the discharge port of a sputtering gas is arranged at the distal end of the second shield provided around the target, the pressure of the distal end portion of the second shield is higher than that of the remaining region. Consequently, it is possible to suppress contamination of the sputtered particles to the other target. Therefore, the invention is desirable in terms of the arrangement of the apparatus.

According to the invention of claim 12 of the present application, since the distal end of the second shield contacts the deposition preventing plate, it is possible to prevent the sputtering gas or the sputtered particles from passing through the gap between the second shield and the deposition preventing plate. The invention is preferable to improve the reliability of the apparatus.

Other features and advantages of the present invention will be apparent from the following description taken in conjunction with the accompanying drawings. Note that the same reference numerals denote the same or like components throughout the accompanying drawings.

BRIEF DESCRIPTION OF DRAWINGS

The accompanying drawings, which are incorporated in and constitute a part of the specification, illustrate exemplary embodiments of the invention and, together with the description, serve to explain the principles of the present invention.

DESCRIPTION OF EMBODIMENTS

The present invention will be described in detail below with reference to the accompanying drawings.

A sputtering apparatus according to an embodiment of the present invention includes a vacuum chamber 201. In the vacuum chamber 201, a substrate stage 206 for holding a substrate (object to be processed) 207, and a plurality of cathode electrodes 203a and 203b for holding targets 203a and 203b, that are provided to face the substrate stage 206. A deposition preventing plate 209 is arranged between the substrate stage 206 and the cathode electrodes 203a and 203b. Holes 213a and 213b are formed at positions facing the plurality of targets 203a and 203b on the deposition preventing plate 209, respectively. A shutter plate 208 is arranged between the deposition preventing plate 209 and the substrate stage 206. The shutter plate 208 has at least one hole 212 for exposing the target 203a or 203b to the substrate 207, and can cause the target 203a or 203b and the substrate 207 to enter a shielded state or non-shielded state (a state in which the target is exposed to the substrate, that is, a state in which a film can be formed on the substrate by sputtering the target) by rotating about a rotation axis 210. As exemplified in FIGS. 2A to 2C, concentric concavo-convex shapes 220 and 221 centered on the rotation axis 210 are formed on surfaces 230 and 231 of the deposition preventing plate 209 and shutter plate 208, that face each other. The concavo-convex shapes 220 and 221 formed on the respective surfaces 230 and 231 are arranged so that the convex portions of the concavo-convex shape 220 respectively face the concave portions of the concavo-convex shape 221 and the concave portions of the concavo-convex shape 220 respectively face the convex portions of the concavo-convex shape 221.

Figure 1A:
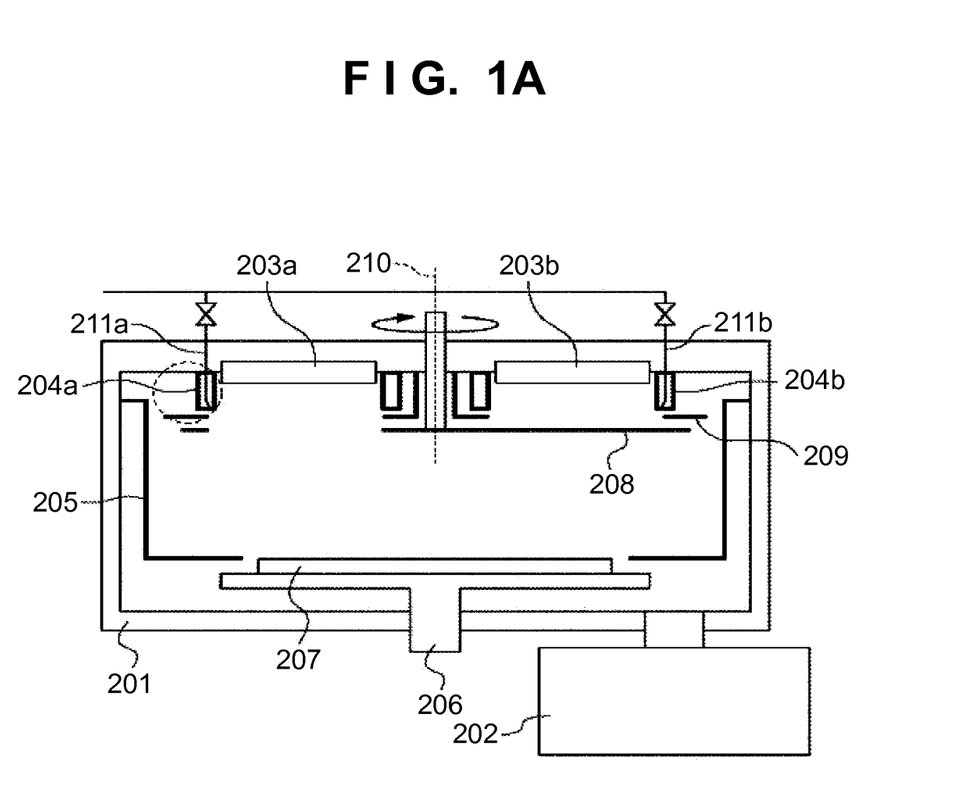
FIG. 1A is a schematic view showing the structure of a sputtering apparatus according to an embodiment of the present invention.

FIG. 1A is a sectional view showing a sputtering apparatus according to the first embodiment of the present invention. The apparatus holds two targets, and a shutter mechanism can be used to switch a target to be used, thereby continuously depositing a stacked structure on a substrate.

In this apparatus, the substrate stage 206 on which the object 207 (substrate) to be processed can be placed or held is arranged in the vacuum chamber 201 made of stainless steel or the like and configured to have an airtight structure. An exhaust portion 202 such as a turbo-molecular pump evacuates the space in the vacuum chamber 201 to be in a nearly vacuum state. The targets 203a and 203b are electrically insulated from the chamber wall of the vacuum chamber 201 at the ground potential. A DC power supply and magnet (neither of which is shown) are provided in each of the targets 203a and 203b. On the other hand, gas introduction portions 211a and 211b can selectively be used, thereby supplying a sputtering gas such as argon gas from the vicinity of one of the targets 203a and 203b to the vacuum chamber 201. When the gas introduction portion 211a or 211b supplies a sputtering gas to supply DC power to the target 203a or 203b, it is possible to cause magnetron discharge to occur on the surface of the target 203a or 203b, thereby performing sputtering.

On the deposition preventing plate 209 arranged between the substrate stage 206 and the targets 203a and 203b, the holes 213a and 213b are formed at positions respectively facing the plurality of targets 203a and 203b. In addition to the deposition preventing plate 209, the sputtering apparatus shown in FIG. 1A can include a first shield 205 surrounding the sputtering space between the substrate stage 206 and the targets 203a and 203b, and cylindrical second shields 204a and 204b respectively surrounding the targets 203a and 203b. The first shield 205, deposition preventing plate 209, and second shields 204a and 204b are provided to prevent sputtered particles from adhering to the chamber wall of the vacuum chamber 201. The deposition preventing plate 209, first shield 205, and second shields 204a and 204b are periodically detached and exchanged, thereby making it possible to prevent a deposited sputtering film from peeling off in the vacuum chamber 201.

The second shields 204a and 204b are cylindrical shields, and shield parts configured to surround the targets 203a and 203b, respectively. As exemplified in FIG. 3, while serving to restrict the scattering direction of the sputtered particles scattered from the target 203, the distal end portion of the second shield 204a or 204b serves as discharge ports 216 of the gas introduction portion 211a or 211b.

The deposition preventing plate 209 is an almost disk-shaped shield positioned below the second shields 204a and 204b, and prevents the sputtered particles from adhering to the inner wall of the vacuum chamber 201 in the vicinity of the targets. The first shield 205 is configured to surround from below the deposition preventing plate 209 to the vicinity of the substrate stage 206.

The shutter mechanism including the shutter plate 208 is a part for switching between the targets 203a or 203b, and using the target. The shutter mechanism includes, for example, the almost circular shield plate 208 and a driving portion (not shown) for driving the shield plate, and can cause the portion between the target 203a or 203b and the object 207 to be processed to enter a shielded state or non-shielded state by driving the shutter plate 208 about the rotation axis 210. For example, when the shutter plate 208 of the shutter mechanism is rotated to cause the target 203a of the targets 203a and 203b to enter the non-shielded state, the sputtering gas supply portion 211a introduces a sputtering gas, and DC power is supplied to the target 203a, the target 203a is sputtered, thereby allowing deposition on the object 207 to be processed by particles generated by sputtering.

Figure 1B:
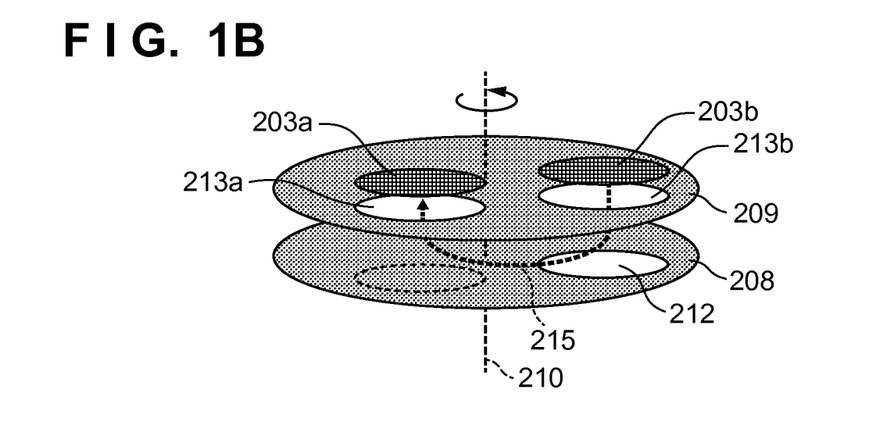
FIG. 1B is a view showing the positional relationship between a deposition preventing plate 209, a shutter plate 208, and targets 203a and 203b in FIG. 1A.
Figure 1C:
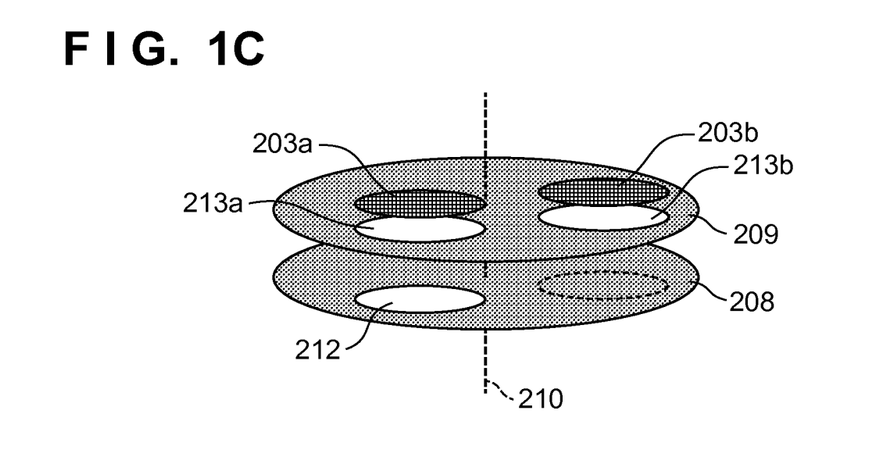
FIG. 1C is a view showing the positional relationship between the deposition preventing plate 209, the shutter plate 208, and the targets 203a and 203b in FIG. 1A.
Figure 1D:
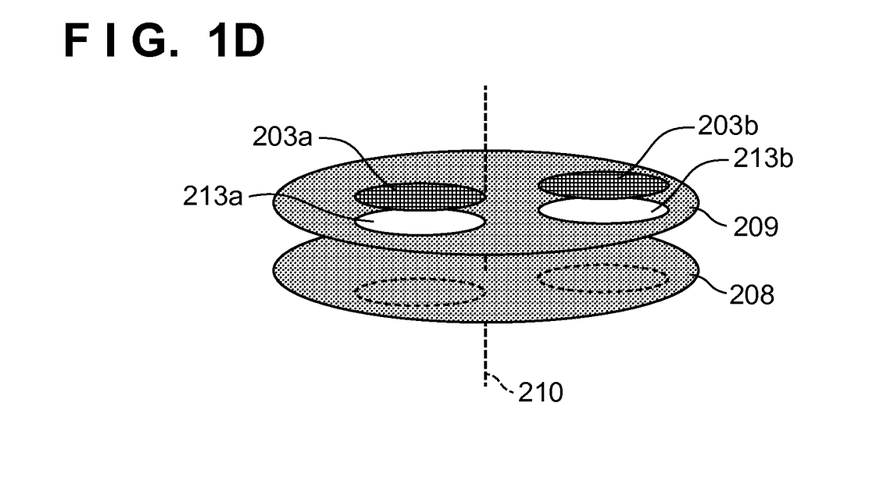
FIG. 1D is a view showing the positional relationship between the deposition preventing plate 209, the shutter plate 208, and the targets 203a and 203b in FIG. 1A.

FIG. 1B is a schematic view exemplifying the positional relationship between the shutter plate 208 of the shutter mechanism, the deposition preventing plate 209, and the targets 203a and 203b, and other parts are omitted for easy understanding of the positional relationship. The targets 203a and 203b are arranged at, for example, an angle of 80° on the same circumference about the rotation axis 210 of the shutter plate 208. The two openings 213a and 213b are formed in the deposition preventing plate 209 so as to pass the sputtered particles from the targets 203a and 203b, and the one opening 212 is formed in the shutter plate 208 of the shutter mechanism. By rotating the shutter plate 208, and moving the opening 212 to a position facing the target 203a, as shown in FIG. 1C, it is possible to supply the sputtered particles from the target 203a to the object 207 to be processed through the openings 213a and 212. If the shutter plate 208 is rotated clockwise by 80° when viewed from the target 203a side so as to set the opening 212 on the target 203b side, as shown in FIG. 1B, it is possible to supply the sputtered particles from the target 203b to the object 207 to be processed. By further rotating the shutter plate 208 clockwise by 80°, and moving the opening 212 to a position facing neither of the targets 203a and 203b, as shown in FIG. 1D, it is possible to set a state in which the sputtered particles from both the targets 203a and 203b do not reach the object 207. This state of the shutter plate 208 is useful, for example, if pre-discharge is required on the target 203b side when deposition is performed using the target 203b without extracting the object 207 to be processed after deposition is performed using the target 203a.

Figure 2A:
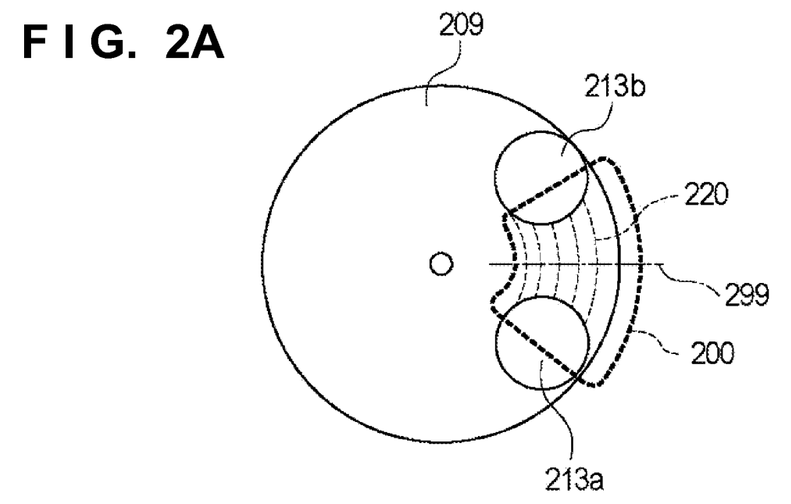
FIG. 2A is a view showing in detail the structure of the shutter plate 208 and deposition preventing plate 209 in the sputtering apparatus shown in FIGS. 1A to 1C.
Figure 2B:
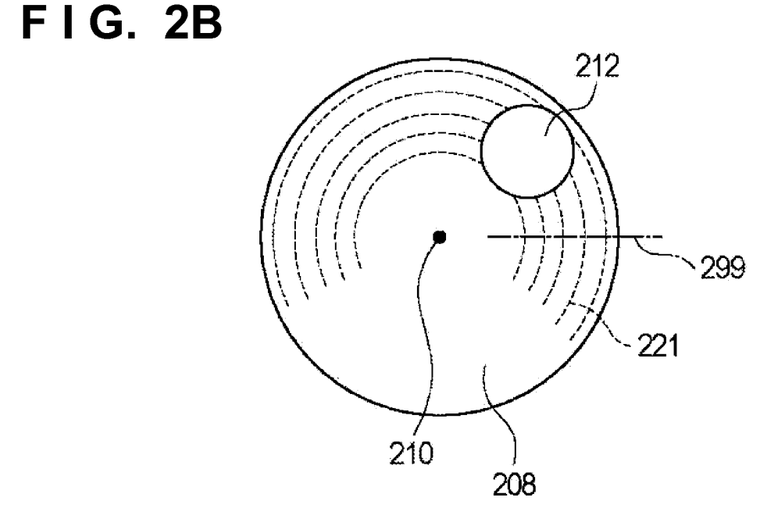
FIG. 2B is a view showing in detail the structure of the shutter plate 208 and deposition preventing plate 209 in the sputtering apparatus shown in FIGS. 1A to 1C.
Figure 2C:
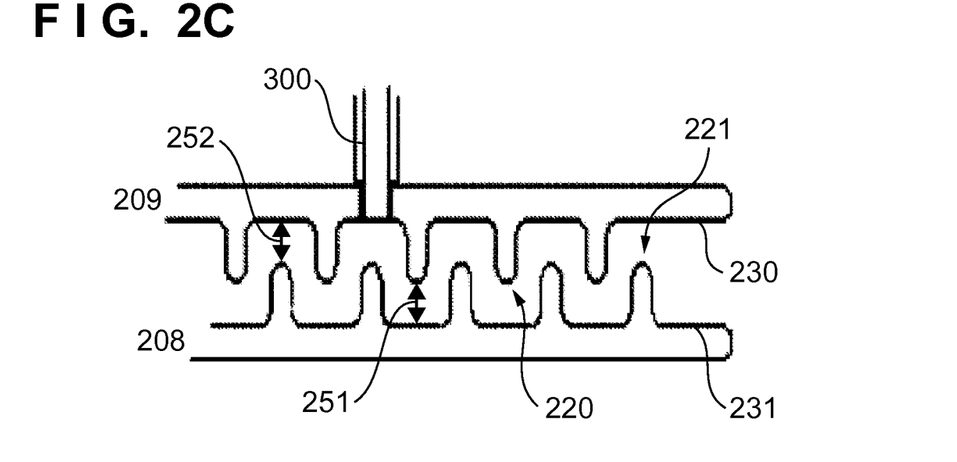
FIG. 2C is a view showing in detail the structure of the shutter plate 208 and deposition preventing plate 209 in the sputtering apparatus shown in FIGS. 1A to 1C.

FIGS. 2A to 2C are views showing the arrangement of the deposition preventing plate 209 and shutter plate 208 in more detail. FIGS. 2A and 2B are views respectively showing the deposition preventing plate 209 and the shutter plate 208 of the shutter mechanism when viewed from the target side. In this example, the opening 212 formed in the shutter plate 208 of the shutter mechanism is drawn to be positioned immediately below the target 203b and opening 213b, and the intermediate position between the two targets 203a and 203b is indicated by a common one-dot dashed line 299. FIG. 2C is a sectional view showing the positional relationship between the deposition preventing plate 209 and the shutter plate 208 of the shutter mechanism at the intermediate position between the two targets (the position of the one-dot dashed line 299 of FIG. 2B).

As shown in FIGS. 2A and 2C, at positions indicated by dotted lines in a region between the targets, which is represented by a region 200 of the deposition preventing plate 209, arcuate convex portions forming the concavo-convex shape 220 are formed on the first shield surface 230 of the deposition preventing plate 209 facing the shutter plate 208 of the shutter mechanism. Furthermore, at positions indicated by broken lines in FIGS. 2B and 2C, arcuate convex portions forming the concavo-convex shape 221 are formed on the second shield surface 231, on the target side, of the shutter plate 208 of the shutter mechanism. That is, the concavo-convex shapes 220 and 221 are concentrically formed about the rotation axis 210 of the shutter plate 208 on the surfaces 230 and 231 of the deposition preventing plate 209 and shutter plate 208 that face each other. Note that the convex portions of the concavo-convex shape 220 respectively face the concave portions of the concavo-convex shape 221, and the concave portions of the concavo-convex shape 220 respectively face the convex portions of the concavo-convex shape 221. A spacing 251 between the convex portion of the concavo-convex shape 220 and the concave portion of the concavo-convex shape 221 and a spacing 252 between the concave portion of the concavo-convex shape 220 and the convex portion of the concavo-convex shape 221 are configured not to be equal to or smaller than a predetermined value at any position. The spacing 251 between the convex portion of the concavo-convex shape 220 and the concave portion of the concavo-convex shape 221 and the spacing 252 between the concave portion of the concavo-convex shape 220 and the convex portion of the concavo-convex shape 221 are typically equal to each other.

Referring to FIG. 2B, the arcuate concavo-convex shape 221 of the shutter plate 208 of the shutter mechanism is formed over an arc angle of about 240°. Even if the shutter plate 208 of the shutter mechanism moves to any of the positions shown in FIGS. 1B, 1C, and 1D, the concavo-convex shape 221 of the shutter plate 208 of the shutter mechanism faces the concavo-convex shape 220 of the deposition preventing plate 209.

This arrangement significantly restricts the motion of the sputtered particles emitted from the target in the radial direction with respect to the rotation axis 210 of the shutter plate 208. That is, the sputtered particles emitted from the target collide against the convex portions of the concavo-convex shape 220 of the deposition preventing plate 209 and those of the concavo-convex shape 221 of the shutter plate 208 at a high probability. This can effectively suppress cross contamination between the targets. In addition, the concavo-convex shapes are concentrically formed about the rotation axis 210 of the shutter plate 208 of the shutter mechanism, and it is possible to maintain clearance necessary for ensuring the reliability of driving, thereby exerting no influence on driving of the shutter plate 208.

Figure 3:
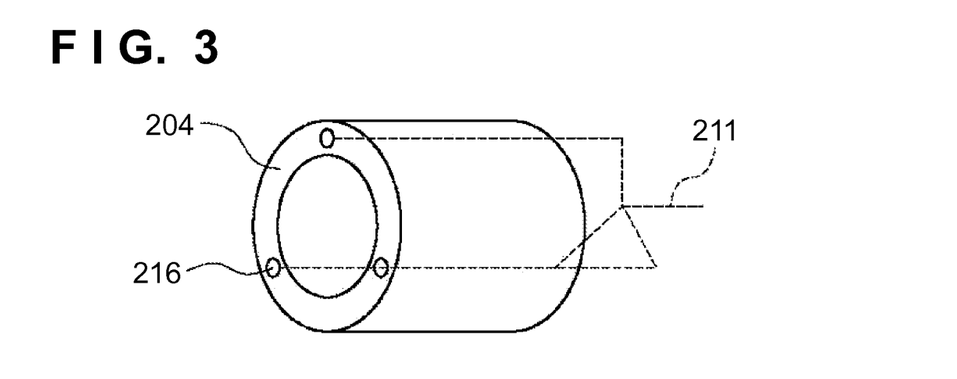
FIG. 3 is a view showing in detail the structure of a second shield 204a or 204b in the sputtering apparatus shown in FIGS. 1A to 1C.

FIG. 3 is a view showing details of the second shields (cylindrical shields) 204a and 204b in FIG. 1A. In each of the second shields 204a and 204b, the three discharge ports 216 of a sputtering gas are provided, and a gas introduction means 211 connects a gas tube having three branches to the discharge ports 216. When the second shield 204a or 204b having such arrangement is provided around the target to be sputtered, and a sputtering gas is discharged, the pressure of the distal end portion of the second shield 204a or 204b becomes higher than that of the surrounding portion due to the influence of discharge of the gas. This makes the sputtered particles tend to collide with gas molecules at the distal end portion of the second shield 204a or 204b, thereby attenuating the kinetic energy. Consequently, the sputtered particles are readily captured on the shield surface before reaching the adjacent target, which is desirable in terms of implementation of the present invention.

In the present invention, the height of the convex portion of each of the concavo-convex shapes 220 and 221 is desirably larger than the above-described spacing 251 or 252. In this case, the concavo-convex shapes 220 and 221 have the positional relationship such that the concave portions and convex portions of the first shield surface 230 and second shield surface 231, that face each other, fit in each other. This shields the path along which the sputtered particles linearly move in the radial direction with respect to the rotation axis 210, thereby increasing the probability of collision of the sputtered particles with the shield surfaces.

According to the present invention, as shown in FIG. 2C, each of the sputtering gas introduction mechanisms 211a and 211b may be configured to have a discharge port 300 on the first shield surface 230 on which the concavo-convex shape 220 of the deposition preventing plate 209 is formed. With this arrangement, it is possible to set the pressure in the space between the first shield surface 230 and the second shield surface 231 higher than that in the surrounding space, thereby hindering the sputtered particles from moving via the space.

Figure 4:
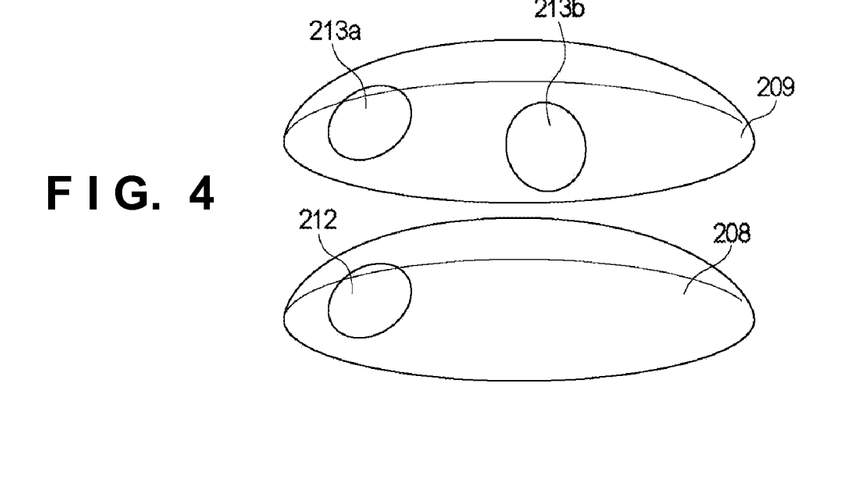
FIG. 4 is a view showing another example of the shapes of the shutter plate 208 and deposition preventing plate 209 in the sputtering apparatus shown in FIG. 3.

In the present invention, by forming the deposition preventing plate 209 and the shutter plate 208 of the shutter mechanism by curved surfaces, as shown in FIG. 4, it is possible to further increase the probability that the sputtered particles collide against the first shield surface 230 and the second shield surface 231 while linearly moving between the adjacent targets.

Figure 5:
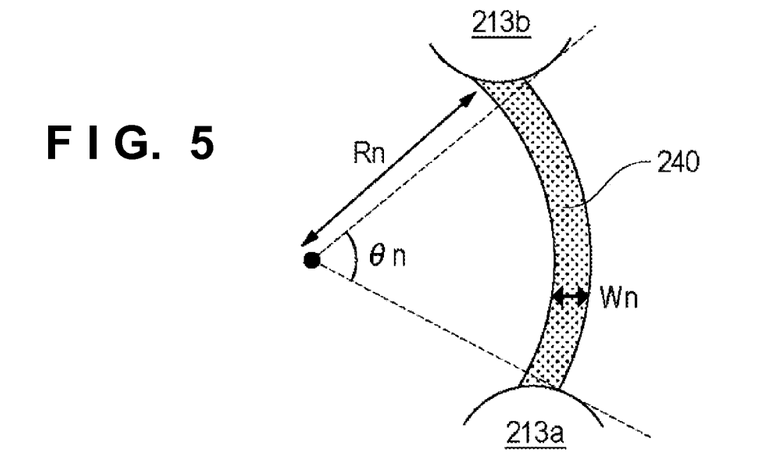
FIG. 5 is a view for explaining a preferred embodiment of an arcuate concave portion according to the present invention.

In the present invention, it is desirable to satisfy $(Rn+Wn)\cos(\theta n/2) \leq Rn$ where $Rn$ represents the inner diameter of the concave portion of the arcuate concavo-convex shape 220 or 221, $Wn$ represents the width of the concave portion, and $\theta n$ represents a smaller one of the arc angles of the convex portions (that is, the external and inner walls) on the both sides of the concave portion. In an arrangement shown in FIG. 5, for example, when the arc angle $\theta n$ of the convex portion forming the external wall is 60° and the inner diameter $Rn$ of the convex portion forming the inner wall is 200 mm, the width $Wn$ of a concave portion 240 is desirably equal to or smaller than about 30.9 mm.

Figure 2D:
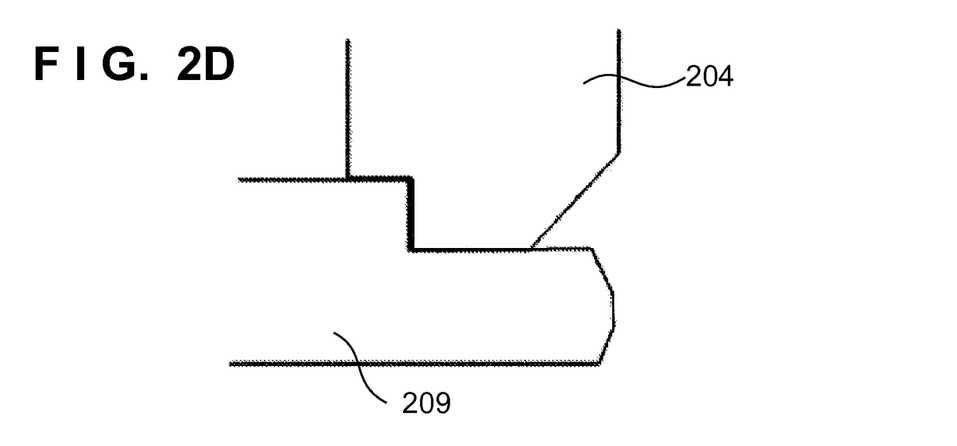
FIG. 2D is an enlarged view showing a region indicated by a dotted line in FIG. 1A.

In the present invention, as shown in FIG. 2D, the distal end of the second shield 204 (204a or 204b) desirably contacts the deposition preventing plate 209 through the perimeter. This arrangement is desirable in terms of ensuring the reliability of the apparatus since it is possible to reduce the probability that the sputtered particles from the target 203a or 203b leak from the deposition preventing plate 209 toward the inner wall of the vacuum chamber 201.

Figure 6:
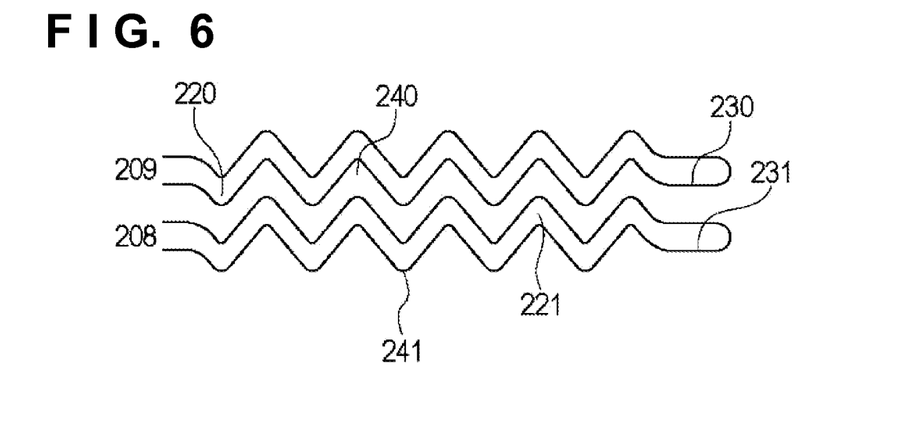
FIG. 6 is a view showing another example of the embodiment of a concavo-convex portion according to the present invention.

An example of the sputtering apparatus according to the desired embodiment of the present invention has been explained above. The mode of the present invention is not limited to this, and changes can be made, as needed. For example, the number of concavo-convex shapes formed on the deposition preventing plate 209 or the shutter plate 208 of the shutter mechanism is not limited. As long as the width is set to be smaller than the size of the target, it is possible to obtain the same effects. The arcuate shape need not be continuous. Even if the arcuate shape is disconnected midway, there is no problem to implement the present invention. The concavo-convex shape may be, for example, a waveform shown in FIG. 6.

Furthermore, the number of targets need only be plural. The targets may be arbitrarily arranged as long as the shutter mechanism (shutter plate) having a rotation mechanism can switch between the targets. The shutter mechanism (shutter plate) need not be formed from one shield plate, and may be formed from a plurality of shield plates. The shape of the shutter mechanism is not limited to the disk shape.

The discharge mechanism for sputtering is not limited to a DC magnetron, and may use an RF or microwave. As a gas to be used, in addition to a rare gas such as xenon and neon as well as argon, a reactive gas such as nitrogen and oxygen can be used.

The gas introduction position, discharge means, the arrangement of the vacuum chamber, and the discharge mechanism according to the present invention can be changed, as needed, as a matter of course.

The first arcuate concavo-convex shape 220 formed on the deposition preventing plate 208 and the second arcuate concavo-convex shape 221 formed on the shutter plate 209 may be formed by films made of materials different from the base materials of the deposition preventing plate 208 and shutter plate 209, respectively. Note that forming the concavo-convex shape by a film indicates that it is possible to use various techniques such as thermal spraying, CVD, and sputtering. A shape may be obtained by forming a film in only the convex portions, or a concavo-convex shape may be formed by changing the film thickness of the formed film depending on the location.

As for the first arcuate concavo-convex shape 220 and the second arcuate concavo-convex shape 221, the sectional shape is not particularly limited as long as an arc is drawn about the rotation axis 210 of the shutter plate 209, and a concavo-convex shape formed by rectangles, triangles, or a curve may be used. Each of the concavo-convex shapes is not limited to an arcuate shape as long as it is formed along the driving orbit of the shutter plate 209. The shapes of the rear surfaces of the surfaces, on which the concavo-convex shapes are formed and which face each other, of the deposition preventing plate 208 and the shutter plate 209 do not influence the effects of the present invention. That is, each of the deposition preventing plate 208 and the shutter plate 209 may be bent in a concavo-convex shape, and have a concavo-convex shape formed on its rear surface side. There is no problem even if a projection or recess is formed on each of the deposition preventing plate 208 and the deposition preventing plate 209 so that no concavo-convex shape is formed on the rear surface side. Furthermore, one of a plurality of arcuate concavo-convex shapes may be formed. There is no problem even if an arc is disconnected midway.

The present invention is not limited to the above embodiment and various changes and modifications can be made without departing from the spirit and scope of the present invention. Therefore, to apprise the public of the scope of the present invention, the following claims are made.

REFERENCE SIGNS LIST 201 vacuum chamber
203a, 203b target
204a, 204b second shield
205 first shield
206 substrate stage
207 substrate (object to be processed)
208 shutter plate
209 deposition preventing plate
212 hole
213a, 213b hole
220 first arcuate concavo-convex shape
221 second arcuate concavo-convex shape
230 first shield surface
231 second shield surface

The invention claimed is:

1. A sputtering apparatus including a vacuum chamber, a substrate stage provided in the vacuum chamber and configured to hold a substrate, a plurality of cathode electrodes provided to face the substrate stage and configured to hold targets, and a deposition preventing plate arranged between the substrate stage and the cathode electrodes and having holes formed at positions respectively facing the cathode electrodes that are configured to hold the targets, the sputtering apparatus comprising a shutter plate arranged between the deposition preventing plate and the substrate stage, the shutter plate having at least one hole formed to expose a target selected from the targets to the substrate, and setting the target and the substrate in a shielded state or non-shielded state by rotating the shutter plate about a rotation axis, wherein:

a concentric concavo-convex structure is formed on a surface of the shutter plate that faces the deposition preventing plate, and is centered about the rotation axis;

a concentric concavo-convex structure is formed on a surface of the deposition preventing plate that faces the shutter plate and is centered about the rotation axis, and wherein the concavo-convex structure on each surface of the shutter plate and the deposition preventing plate is formed so that concave portions of each of the shutter plate and the deposition preventing plate are in axial alignment with convex portions of each of the shutter plate and the deposition preventing plate, and arranged such that at least two convex portions of the shutter plate fit within respective concave portions of the deposition preventing plate, and at least two convex portions of the deposition preventing plate fit within respective concave portions of the shutter plate, and the concentric concavo-convex structure formed on the deposition preventing plate extends from an edge of one of the holes of the deposition preventing plate to an edge of another of the holes of the deposition preventing plate.

2. The sputtering apparatus according to claim 1, wherein a width of the concave portions of the concavo-convex structures is smaller than a size of the target.

3. The sputtering apparatus according to claim 1, wherein a height of the convex portions of the concavo-convex structures formed on the shutter plate is equal to a height of the convex portions of the concavo-convex structures formed on the deposition preventing plate.

4. The sputtering apparatus according to claim 1, wherein a height of the convex portions of the concavo-convex structures formed on the shutter plate and a height of the convex portions of the concavo-convex structures formed on the deposition preventing plate are larger than a spacing between the convex portions of the concavo-convex structures formed on the shutter plate and the concave portions of the concavo-convex structures formed on the deposition preventing plate and a spacing between the concave portions of the concavo-convex structures formed on the shutter plate and the convex portions of the concavo-convex structures formed on the deposition preventing plate.

5. The sputtering apparatus according to claim 1, wherein the concavo-convex structures formed on the deposition preventing plate and the concavo-convex structures formed on the shutter plate are formed by films made of materials different from base materials of the deposition preventing plate and the shutter plate, respectively.

6. The sputtering apparatus according to claim 1, wherein the plurality of cathode electrodes are arranged on a same circumference about the rotation axis.

7. The sputtering apparatus according to claim 1, wherein the surfaces of the shutter plate and the deposition preventing plate, that face each other, are curved surfaces.

8. The sputtering apparatus according to claim 1, wherein the deposition preventing plate satisfies $(Rn+Wn)\cos(\theta n/2) \leq Rn$ where $Rn$ represents an inner diameter of the concave portions of the concavo-convex structures on the surface facing the shutter plate, $Wn$ represents a width of the concave portions, and $\theta n$ represents an angle formed by two radial lines extending from a center of the deposition preventing plate to adjacent edges of two adjacent ones of the holes in the deposition preventing plate.

9. The sputtering apparatus according to claim 1, further comprising
  a first shield configured to surround a sputtering space between the substrate stage and the targets, and
  a second shield having a cylindrical shape and configured to surround an outer circumferential surface of the target.

10. The sputtering apparatus according to claim 1, wherein the deposition preventing plate includes a discharge port of a sputtering gas on the surface facing the shutter plate.

11. The sputtering apparatus according to claim 9, wherein a discharge port of a sputtering gas is provided at a distal end of the second shield.

12. The sputtering apparatus according to claim 9, wherein the second shield and the deposition preventing plate contact each other through a perimeter of the second shield.

13. A sputtering apparatus including a vacuum chamber, a substrate stage configured to hold a substrate in the vacuum chamber, a plurality of cathode electrodes configured to hold targets in the vacuum chamber, and a deposition preventing plate arranged between the substrate stage and the plurality of cathode electrodes and having holes formed at positions respectively facing the cathode electrodes that are configured to hold the targets, the sputtering apparatus comprising
  a shutter plate arranged between the deposition preventing plate and the substrate stage, the shutter plate having a hole for exposing the target to the substrate, and setting the target and the substrate in a shielded state or non-shielded state by rotating the shutter plate about a rotation axis,
wherein:
  a concentric concavo-convex structure is formed on a surface of the shutter plate that faces the deposition preventing plate, and is centered about the rotation axis;
  a concentric concavo-convex structure is formed on a surface of the deposition preventing plate that faces the shutter plate and is centered about the rotation axis so that the concentric concavo-convex structures of the shutter plate and the deposition preventing plate do not contact each other,
  wherein the concentric concavo-convex structure on each surface of the shutter plate and the deposition preventing plate is formed so that concave portions of each of the shutter plate and the deposition preventing plate are in axial alignment with convex portions of each of the shutter plate and the deposition preventing plate, and arranged such that at least two convex portions of the shutter plate fit within respective concave portions of the deposition preventing plate, and at least two convex portions of the deposition preventing plate fit within respective concave portions of the shutter plate; and
  the concentric concavo-convex structure formed on the deposition preventing plate extend extends from an edge of one of the holes of the deposition preventing plate to an edge of another of the holes of the deposition preventing plate.

14. The sputtering apparatus according to claim 1, wherein arc angles of the concentric concavo-convex structures are less than 360°.

15. The sputtering apparatus according to claim 1, further comprising a gas introduction mechanism having a discharge port arranged on a surface of the deposition preventing plate, on which the concentric concavo-convex structure is formed.

16. The sputtering apparatus according to claim 15, wherein the discharge port is arranged on one of the concave portions of the concentric concavo-convex structure of the deposition preventing plate.

17. The sputtering apparatus according to claim 13, wherein arc angles of the concentric concavo-convex structure is less than 360°.

18. The sputtering apparatus according to claim 13, further comprising a gas introduction mechanism having a discharge port arranged on a surface of the deposition preventing plate, on which the concentric concavo-convex structure is formed.

19. The sputtering apparatus according to claim 18, wherein the discharge port is arranged on the concave portion the concentric concavo-convex structure of the deposition preventing plate.

* * * * *